(12) United States Patent
Pendse

(10) Patent No.: US 7,323,774 B2
(45) Date of Patent: Jan. 29, 2008

(54) INTEGRATED CIRCUIT PACKAGE SYSTEM WITH PEDESTAL STRUCTURE

(75) Inventor: Rajendra D. Pendse, Fremont, CA (US)

(73) Assignee: Stats Chippac Ltd., Singapore (SG)

( * ) Notice: Subject to any disclaimer, the term of this patent is extended or adjusted under 35 U.S.C. 154(b) by 51 days.

(21) Appl. No.: 11/306,808

(22) Filed: Jan. 11, 2006

(65) Prior Publication Data

US 2007/0158820 A1 Jul. 12, 2007

(51) Int. Cl.
*H01L 23/12* (2006.01)
*H01L 23/053* (2006.01)

(52) U.S. Cl. .............. 257/700; 257/686; 257/E25.027; 257/735; 257/E23.015

(58) Field of Classification Search .............. 257/678, 257/686, 777, 778, 692, 700, 735, 723, E25.023, 257/E25.027, E23.015, E23.023, E23.024, 257/E23.062
See application file for complete search history.

(56) References Cited

U.S. PATENT DOCUMENTS

| 5,710,695 | A | 1/1998 | Manteghi ................. 361/813 |
| 5,787,575 | A | 8/1998 | Banerjee et al. ............. 29/832 |
| 5,847,455 | A | 12/1998 | Manteghi ................. 257/737 |
| 6,064,113 | A | 5/2000 | Kirkman ................. 257/691 |
| 6,083,776 | A | 7/2000 | Manteghi ................. 438/123 |
| 6,762,488 | B2 * | 7/2004 | Maeda et al. ............. 257/686 |
| 2004/0212088 | A1 * | 10/2004 | Chen et al. ............... 257/738 |

* cited by examiner

*Primary Examiner*—Wai-Sing Louie
*Assistant Examiner*—Sarah K Salerno
(74) *Attorney, Agent, or Firm*—Mikio Ishimaru

(57) ABSTRACT

An integrated circuit package system includes providing a substrate having a bond finger thereon and forming a pedestal on a portion of the bond finger. A first die is mounted on the substrate and adjacent to the bond finger. A portion of the first die, a portion of the bond finger, and a portion of the pedestal are embedded in an resin layer with an exposed portion of the pedestal protruding from the resin layer. A second die is mounted on the first die and electrically coupled to the exposed portion of the pedestal.

20 Claims, 1 Drawing Sheet

INTEGRATED CIRCUIT PACKAGE SYSTEM WITH PEDESTAL STRUCTURE

TECHNICAL FIELD

The present invention relates generally to integrated circuit package systems, and more particularly to a system for manufacturing an integrated circuit package system.

BACKGROUND ART

In the electronics industry, as products such as cell phones and camcorders become smaller and smaller, increased miniaturization of integrated circuit (IC) packages has become more and more critical. At the same time, higher performance and lower cost have become essential for new products.

One conventional integrated circuit package includes a wire bond die stacked on a flip chip die on a substrate. Bonding fingers are located outside the footprint of flip chip die on the substrate. A resin, which fills the gap between the flip chip die and the substrate, also extends beyond the footprint of the die in a resin fillet or bleed.

The bonding fingers must be outside the resin fillet otherwise electrical wires from the wire bond die cannot be connected to the bonding fingers because the electrical wires cannot be bonded through the resin. This means that the electrical wires must connect beyond the resin fillet and also means that the package size cannot be decreased beyond a certain point.

The typical size of the resin fillet is about 1.5-3 mm, resulting in a lateral package size increase of 3-6 mm due to the resin fillet on both sides of the die. For a nominal package size of 12×12 mm, this would result in a package size increase of 25-50% and an increase in the package footprint (area) of 50-100% over what it would be if it were possible to connect within the resin fillet.

However, no way has been found to connect within the resin fillet due to the difficulty of forming reliable conductive bonds through a resin while a need still remains for an integrated circuit package system having a reduced package size. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system includes providing a substrate having a bond finger thereon and forming a pedestal on a portion of the bond finger. A first die is mounted on the substrate and adjacent to the bond finger. A portion of the first die, a portion of the bond finger, and a portion of the pedestal are embedded in an resin layer with an exposed portion of the pedestal protruding from the resin layer. A second die is mounted on the first die and electrically coupled to the exposed portion of the pedestal.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
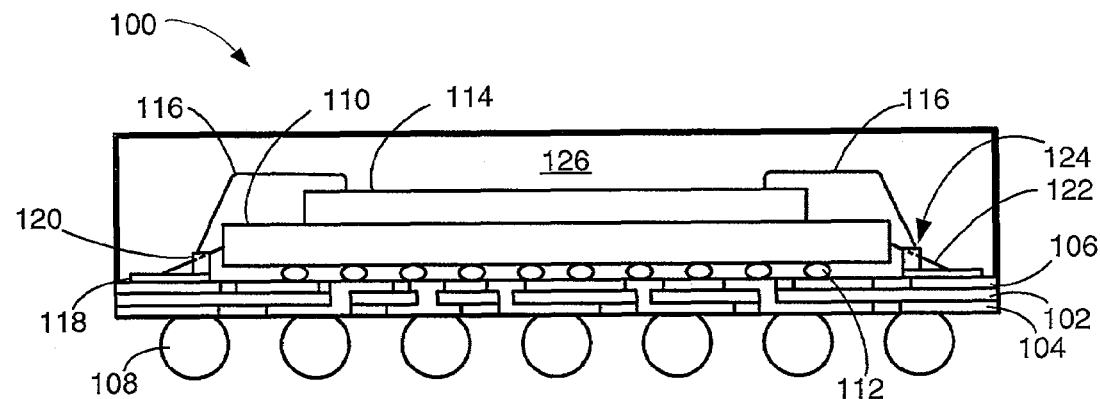
FIG. 1 is a cross-sectional view of an integrated circuit package system in accordance with an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the device are semi-diagrammatic and not to scale and, particularly, some of the dimensions are for the clarity of presentation and are shown greatly exaggerated in the drawing FIGS. Generally, the device can be operated in any orientation. The same numbers are used in all the drawing FIGS. to relate to the same elements.

The term "horizontal" as used herein is defined as a plane parallel to the conventional plane or surface of a die, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown FIG. 1 a cross-sectional view of an integrated circuit package system 100 in accordance with an embodiment of the present invention. The integrated circuit package system 100 has a substrate 102, which may be a package substrate, a printed circuit board substrate, an integrated circuit die, or a silicon substrate. In one embodiment for a package substrate, the substrate 102 has a first conductive layer 104 and a second conductive layer 106. Solder balls 108 may be mounted to the first conductive layer 104.

A first die 110, which may be a flip chip die or wire bond die, is mounted to the second conductive layer 106 on the substrate 102. For a flip chip die (shown), solder bumps 112 electrically connect the first die 110 to the second conductive layer 106. For a wire bond die (not shown), wires similar to wires 116 will electrically connect the first die 110 to the second conductive layer 106 in the same way that a second die 114 is electrically connected to the top of the substrate 102. The second die 114, or a wire bond die, is mounted to the first die 110. Wires 116 from the second die 114 are attached to the top of the substrate 102.

Bond fingers 118 are formed on the second conductive layer 106 radially adjacent to the first die 110. A pedestal 120 is deposited on a portion of the bond fingers 118 adjacent to the first die 110 to allow for a radially closer connection between the second die 114 and the pedestal 120. The pedestal 120 also provides a clean bonding surface. The pedestal 120 may be deposited by either plating, screen printing, stud bumping or other methods. The pedestal 120 is of material with a wire bondable finish on the top surface of the pedestal 120 such as copper, nickel, gold, or a combination thereof.

The solder bumps 112, a portion of the first die 110, a portion of the bond fingers 118, and a portion of the pedestal 120 are embedded within a resin layer 122 called the resin fillet or bleed.

The height of the pedestal 120 depends on the resin layer 122 and the desired location for connecting with wires 116. For example, it has been discovered that based on typical values, a height of 50-100 mm is likely to be required. Thus, a top exposed portion 124 of the pedestal 120 protrudes above the resin layer 122. Wires 116 electrically connect the second die 114 to the top exposed portion 124 of the pedestal 120.

An encapsulant 126 encapsulates the first die 110, the second die 114, the bond finger 118, the resin layer 122, and the pedestal 120.

Figure 2:
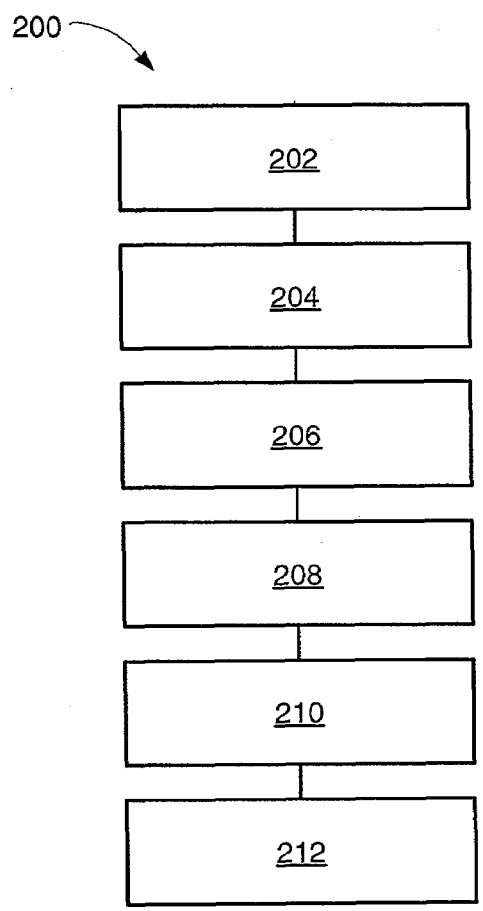
FIG. 2 is a flow chart of a system for building an integrated circuit package system in accordance with an embodiment of the present invention.

Referring now to FIG. 2, therein is shown a flow chart of an integrated circuit package system for manufacturing a package system 100 in accordance with an embodiment of the present invention. The system 200 includes providing a substrate having a bond finger thereon in a block 202; forming a pedestal on a portion of the bond finger in a block 204; mounting a first die on the substrate and adjacent to the bond finger in a block 206; embedding a portion of the first die, a portion of the bond finger, and a portion of the pedestal in an resin layer with an exposed portion of the pedestal protruding from the resin layer in a block 208; mounting a second die on the first die in a block 210; and electrically coupling the second die to the exposed portion of the pedestal in a block 212.

It has been discovered that the present invention thus has numerous aspects.

An aspect is that the present invention results in reduction of package size thus leading to both miniaturization and cost reduction over the prior art design.

Yet another important aspect of the present invention is that it valuably supports and services the historical trend of reducing costs, simplifying systems, and increasing performance.

These and other valuable aspects of the present invention consequently further the state of the technology to at least the next level.

The resulting processes and configurations are straightforward, cost-effective, uncomplicated, highly versatile and effective, can be implemented by adapting known technologies, and are thus readily suited for efficiently and economically manufacturing large die IC packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. An integrated circuit package system comprising:
providing a substrate having a bond finger thereon;
forming a pedestal on a portion of the bond finger;
mounting a first die on the substrate and adjacent to the bond finger;
embedding a portion of the first die, a portion of the bond finger, and a portion of the pedestal in an resin layer with an exposed portion of the pedestal protruding from the resin layer;
mounting a second die on the first die; and
electrically coupling the second die to the exposed portion of the pedestal.

2. The system as claimed in claim 1, wherein electrically coupling further comprises:
connecting wires between a top surface of the second die and the exposed portion of the pedestal.

3. The system as claimed in claim 1, wherein mounting the first die further comprises:
providing a flip chip die; and
mounting the flip chip die on the substrate with bumps.

4. The system as claimed in claim 1, wherein mounting the second die further comprises:
mounting a wire bond die to the first die.

5. The system as claimed in claim 1 further comprising:
encapsulating the first die, the second die, the bond finger, the resin layer, and the pedestal with an encapsulant.

6. An integrated circuit package system comprising:
providing a substrate having a bond finger thereon;
forming a pedestal on a portion of the bond finger;
mounting a flip chip die on the substrate and adjacent to the bond finger;
embedding a bottom portion of the flip chip die, a portion of the bond finger, and a portion of the pedestal in an resin layer with an exposed portion of the pedestal protruding from the resin layer;
mounting a wire bond die to the flip chip die; and
electrically coupling the wire bond die to the exposed portion of the pedestal.

7. The system as claimed in claim 6 wherein electrically coupling further comprises:
connecting wires between a top surface of the wire bond die and the exposed portion of the pedestal.

8. The system as claimed in claim 6 wherein mounting the flip chip die further comprises:
mounting the flip chip die on the substrate with solder bumps.

9. The system as claimed in claim 6 wherein embedding further comprises:
exposing a top radially outer portion of the pedestal.

10. The system as claimed in claim 6 further comprising:
encapsulating the flip chip die, the wire bond die, the bond finger, the resin layer, and the pedestal with an encapsulant.

11. An integrated circuit package system comprising:
a substrate having a bond finger thereon;
a pedestal formed on a portion of the bond finger;
a first die on the substrate and adjacent the bond finger;
a resin layer embedding a portion of the first die, a portion of the bond finger, and a portion of the pedestal;
a second die mounted to the first die; and
a wire electrically coupled to the second die and an exposed portion of the pedestal protruding from the resin layer.

12. The system as claimed in claim 11 wherein the first die further comprises:
a flip chip die with bumps mounted on the substrate.

13. The system as claimed in claim 11 wherein the second die further comprises:
a wire bond die mounted on the first die.

14. The system as claimed in claim 11 wherein the exposed portion of the pedestal further comprises:
an exposed top radially outer portion of the pedestal.

15. The system as claimed in claim 11 further comprising:
an encapsulant encapsulating the first die, the second die, the bond finger, the resin layer, the pedestal, and the wire.

16. The system as claimed in claim 11 wherein:
the first die is a flip chip die;
the second die is a wire bond die;
the substrate has bond fingers adjacent to and extending radially outward from the flip chip die;
pedestals are formed on radially inner portion of the bond finger and are radially adjacent to the flip chip die; and
wires electrically couple the wire bond die and the pedestals.

17. The system as claimed in claim 16 wherein the flip chip die further comprises:
solder bumps connected between the flip chip die and the substrate.

18. The system as claimed in claim 16 wherein the exposed portion of the pedestal further comprises:
an exposed top radially outer portion of the pedestal.

19. The system as claimed in claim 16 further comprising:
an encapsulant encapsulating the flip chip die, the wire bond die, the bond finger, the resin layer, the pedestal, and the wire.

20. The system as claimed in claim 16 wherein the pedestal has a top surface with a wire bondable finish.

* * * * *